United States Patent
Lin et al.

(10) Patent No.: US 9,741,959 B1
(45) Date of Patent: Aug. 22, 2017

(54) LIGHT EMITTING DEVICE

(71) Applicant: Industrial Technology Research Institute, Chutung (TW)

(72) Inventors: Yi-Ping Lin, Chutung (TW); Jung-Yu Li, Chutung (TW); Guan-Yu Chen, Chutung (TW); Shih-Pu Chen, Chutung (TW); Jin-Han Wu, Chutung (TW); Cheng-Chang Chen, Chutung (TW)

(73) Assignee: Industrial Technology Research Institute, Chutung (TW)

( * ) Notice: Subject to any disclaimer, the term of this patent is extended or adjusted under 35 U.S.C. 154(b) by 0 days.

(21) Appl. No.: 15/099,771

(22) Filed: Apr. 15, 2016

(30) Foreign Application Priority Data

Feb. 19, 2016 (TW) .............................. 105104892 A (51) Int. Cl.
*H01L 51/52* (2006.01)
*H01L 51/50* (2006.01)

(52) U.S. Cl.
CPC ...... *H01L 51/5203* (2013.01); *H01L 51/5036* (2013.01); *H01L 51/5215* (2013.01)

(58) Field of Classification Search
CPC .................... H01L 51/5203; H01L 51/5036
See application file for complete search history.

(56) References Cited

U.S. PATENT DOCUMENTS

| | | |
|---|---|---|
| 5,707,745 A | 1/1998 | Forrest et al. |
| 5,811,833 A | 9/1998 | Thompson |
| 6,528,188 B1 | 3/2003 | Suzuki et al. |
| 6,670,772 B1 | 12/2003 | Arnold et al. |
| 7,247,394 B2 | 7/2007 | Hatwar et al. |

(Continued)

FOREIGN PATENT DOCUMENTS

| | | |
|---|---|---|
| CN | 1170383 A | 1/1998 |
| CN | 1551689 A | 12/2004 |

(Continued)

OTHER PUBLICATIONS

CN 102956838 English Abstract.

(Continued)

*Primary Examiner* — Jarrett Stark
*Assistant Examiner* — Charles N Ausar-El
(74) *Attorney, Agent, or Firm* — McCarter & English, LLP; Yu Lu (57) ABSTRACT

A light emitting device includes an electrode layer, a first metal layer, an organic material layer and a second metal layer stacked sequentially. The first metal layer includes a first metal portion and a second metal portion separated from the first metal portion at a first lateral distance, and the first metal portion and the second metal portion have a first period. The organic material layer includes a first emitting region separating the first metal portion and the second metal portion. The first lateral distance and the first period enable a lateral plasma coupling generated between the first metal portion and the second metal portion, such that light generated by the organic material layer at the first emitting region has a gain in a first waveband, or a peak wavelength of the light generated by the first emitting region shifts to the first waveband.

30 Claims, 8 Drawing Sheets

(56) References Cited

U.S. PATENT DOCUMENTS

| | | | |
|---|---|---|---|
| 8,134,291 B2* | 3/2012 | Lee | B82Y 30/00 313/504 |
| 8,269,214 B2 | 9/2012 | Smigelski, Jr. et al. | |
| 8,304,796 B2 | 11/2012 | Fukuda | |
| 8,415,875 B2 | 4/2013 | Smith et al. | |
| 8,618,729 B2 | 12/2013 | Frischeisen et al. | |
| 2003/0030370 A1 | 2/2003 | Tada | |
| 2005/0280008 A1 | 12/2005 | Ricks et al. | |
| 2008/0272690 A1 | 11/2008 | Kuma et al. | |
| 2009/0170230 A1 | 7/2009 | Kidu et al. | |
| 2011/0151605 A1 | 6/2011 | Yoon | |
| 2012/0032138 A1 | 2/2012 | Kim et al. | |
| 2012/0235197 A1 | 9/2012 | Okuyama | |
| 2014/0183464 A1 | 7/2014 | Baek et al. | |
| 2015/0236290 A1* | 8/2015 | Li | H01L 51/5209 257/40 |
| 2015/0243931 A1 | 8/2015 | Fukuura | |
| 2016/0049608 A1 | 2/2016 | Hack et al. | |
| 2016/0218313 A1 | 7/2016 | Lin et al. | |
| 2016/0268533 A1 | 9/2016 | Lin et al. | |

FOREIGN PATENT DOCUMENTS

| | | |
|---|---|---|
| CN | 1939096 A | 3/2007 |
| CN | 102104101 A | 6/2011 |
| CN | 102956838 A | 3/2013 |
| CN | 103904100 A | 7/2014 |
| TW | 200402011 A | 2/2004 |
| TW | 200519413 | 6/2005 |
| TW | I304707 B | 12/2008 |
| TW | 201234583 A | 8/2012 |
| TW | I401818 B | 7/2013 |
| TW | I406587 B | 8/2013 |
| TW | 201403901 A | 1/2014 |
| TW | 201419521 A | 5/2014 |
| TW | 201431853 A | 8/2014 |
| TW | 201436334 A | 9/2014 |
| TW | 201444077 A | 11/2014 |
| TW | 201533944 A | 9/2015 |
| WO | WO-2013099875 A1 | 7/2013 |
| WO | 2014119385 A1 | 8/2014 |

OTHER PUBLICATIONS

TW I304707 English Abstract.
TW 201431853 English Abstract.
TW 201436334 English Abstract.
Office Action issued Apr. 11, 2016 in TW 10520428540.
Office Action issued Oct. 14, 2016 in TW 1052125360.
TW200402011 English Abstract.
TW201234583 English Abstract.
TW201419521 English Abstract.
TW201444077 English Abstract.
TW201533944 English Abstract.
TWI401818 English Abstract.
TWI406587 English Abstract.
U.S. Appl. No. 14/793,011, filed Jul. 7, 2015, Yi-Ping Lin et al.
Feng and Okamoto, "Enhancement of electroluminescence through a two-dimensional corrugated metal film by grating induced surface-plasmon cross coupling," *Optics Letters*, 30(17):2302-2304 (2005).
Koller et al., "Surface plasmon coupled electroluminescent emission," *Applied Physics Letters*, 92:103304-1-103304-3 (2008).
Koo et al., "Light extraction from organic light-emitting diodes enhanced by spontaneously formed buckles," *Nature Photonics*, 4:222-226 (2010).
Wedge et al., "Surface plasmon polariton mediated emission of light from top-emitting organic light-emitting diode type structures," *Organic Electronics*, 8:136-147 (2007).
Yates et al., "Surface plasmon-polariton mediated emission from phosphorescent dendrimer light-emitting diodes," *Applied Physics Letters*, 88:161105-1-161105-3 (2006).
CN102104101 English abstract.
CN1551689(A) English abstract.
TW200519413 English abstract.
TW201403901(A) English abstract.
CN1170383 English abstract.
CN1939096 English abstract.
CN103904100 English abstract.
WO2014119385 English abstract.
CN201510371781.2 Office Action dated Mar. 28, 2017.
CN201510371554.7 Office Action dated Mar. 28, 2017.

* cited by examiner

LIGHT EMITTING DEVICE

CROSS-REFERENCE TO RELATED APPLICATIONS

This application claims foreign priority under 35 U.S.C. §119(a) to Patent Application No. 105104892, filed on Feb. 19, 2016, in the Intellectual Property Office of Ministry of Economic Affairs, Republic of China (Taiwan, R.O.C.), the entire contents of which are incorporated herein by reference and made a part of this specification.

BACKGROUND OF THE INVENTION

1. Technical Field

The present disclosure relates to a light emitting device emitting blue light, red light or white light.

2. Description of Related Art

Organic light-emitting diodes (OLEDs) have advantages of being light-weight, thin, flexible and producing low glare. OLEDs also satisfy the current market demands for illumination products by their particular functions in providing high color rendering and full spectrum.

Recently, the efficiency and lifespan of the R, G and B light emitting materials of OLED have been improved significantly. Among them, green phosphorescent material has the best light emitting efficiency and operational lifetime, whereas the crucial material, i.e., the blue light emitting material of the white light OLED device has relatively low operational lifetime of merely several hundred hours.

Currently Flrpic (Bis(4,6-difluorophenylpyridinato-N, C2)picolinatoiridium) has been documented to be used as the main blue phosphorescent material, yet Flrpic has too short operational lifetime to be generally applicable for illumination products even though full phosphorescent white light OLED device has high efficiency.

Therefore, how to develop a while light OLED device with high efficiency and long operational lifetime is so far the main issue in the market.

SUMMARY OF THE INVENTION

According to one embodiment, the present disclosure provides a light emitting device, which comprises an electrode layer, a first metal layer, a second metal layer, and an organic material layer. The first metal layer is disposed on the electrode layer, and comprises a first metal portion and a second metal portion. The first metal portion and the second metal portion have a first period, and the first metal portion and the second metal portion are separated from each other by a first lateral distance. The second metal layer is disposed above the first metal layer. The organic material layer is disposed between the electrode layer and the second metal layer, and comprises a first emitting region separating the first metal portion and the second metal portion. The first lateral distance and the first period enable a lateral plasma coupling generated between the first metal portion and the second metal portion, such that light generated by the organic material layer at the first emitting region has a gain in a first waveband, or a peak wavelength of the light generated by the first emitting region shifts to the first waveband.

According to another embodiment, the present disclosure provides a light emitting device, which comprises an electrode layer, a metal layer and an organic material layer. The metal layer is disposed above the electrode layer. The organic material layer is disposed between the electrode layer and the metal layer, and comprises a first emitting portion protruding into the metal layer. The metal layer comprises a first metal region and a second metal region separated by the first emitting portion. The first metal region and the second metal region have a first period, and are separated from each other by a first lateral distance. The first period and the first lateral distance enable a lateral plasma coupling generated in the first metal region and the second metal region, such that light generated by the organic material layer at the first emitting portion has a gain in a first waveband, or a peak wavelength of the light generated by the first emitting portion shifts to the first waveband.

DETAILED DESCRIPTION OF THE INVENTION

In the following detailed description, for purposes of explanation, numerous specific details are set forth in order to provide a thorough understanding of the disclosed embodiments.

It will be apparent, however, that one or more embodiments may be practiced without these specific details. In other instances, well-known structures and devices are schematically shown in order to simplify the drawing.

First Embodiment

A light emitting device of a first embodiment according to the present disclosure comprises an electrode layer, a first metal layer, a second metal layer, and an organic material layer. The first metal layer is disposed on the electrode layer, and comprises a first metal portion and a second metal portion. The first metal portion and the second metal portion have a first period, and the first metal portion and the second metal portion are separated from each other by a first lateral distance. The second metal layer is disposed above the first metal layer. The organic material layer is disposed between the electrode layer and the second metal layer, and comprises a first emitting region separating the first metal portion and the second metal portion. The first lateral distance and the first period enable a lateral plasma coupling generated between the first metal portion and the second metal portion, such that light generated by the organic material layer at the first emitting region has a gain in a first waveband, or a peak wavelength of the light generated by the first emitting region shifts to the first waveband.

Figure 1A:
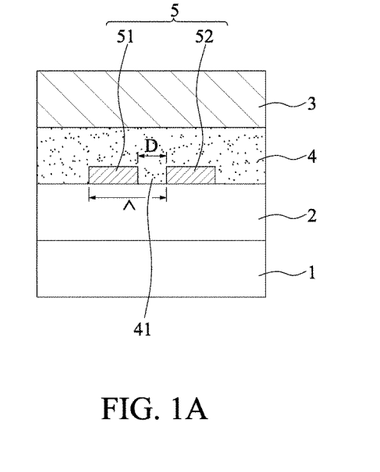
FIG. 1A is a schematic cross-sectional view of a light emitting device according to a first embodiment of the present disclosure.

Refer to FIG. 1A showing a schematic cross-sectional view of a light emitting device according to first embodiment of the present disclosure. The light emitting device comprises a substrate 1, and an electrode layer 2, a first metal layer 5, an organic material layer 4 and a second metal layer 3 sequentially stacked on the substrate 1.

The substrate 1 is made of, for example, glass or transparent plastic.

The electrode layer 2 can be a transparent conductive film, such as Iridium Tin Oxide (ITO), coated on the substrate 1 and generally serves as an anode. When a voltage is applied, the holes injected from the electrode layer 2 enter the organic material layer 4.

The second metal layer 3 contains material such as metal material and usually serves as a cathode. When a voltage is applied, the electrons injected from the second metal layer 3 enter the organic material layer 4. The second metal layer 3 can change the path of the light projected thereon as the material or the thickness of the second metal layer 3 varies. For example, the metal layer containing metal can reflect light, nano metal wires can allow light to pass through, a thin metal layer can be translucent, or a thick metal layer can be opaque.

The first metal layer 5 comprises a first metal portion 51 and a second metal portion 52 disposed on the electrode layer 2. The first metal portion 51 and the second metal portion 52 are separated from each other by a lateral distance D along the direction perpendicular to the stacking direction of the devices. The first metal portion 51 and the second metal portion 52 have a period Λ defined by a distance from the left edge (or right edge) of the first metal portion 51 to the left edge (or right edge) of the second metal portion 52.

The organic material layer 4 is sandwiched between the electrode layer 2 and the second metal layer 3, and is also formed between the first metal layer 5 and the second metal layer 3. The organic material layer 4 can act as a hole transfer/injection layer, an emitting layer, or an electron transfer/injection layer. The emitting layer can comprise a hole transport material and an electron transport material that can interact with each other to generate exciplexes. A spectrum of the light generated by the organic material layer 4 can cover full spectra of visible lights, approximately from 400 nm to 750 nm. The organic material layer 4 comprises a first emitting region 41 separating the first metal portion 51 and the second metal portion 52. The width of the first emitting region 41 is the lateral distance D between the first metal portion 51 and the second metal portion 52. The period Λ and the lateral distance D are configured to enable a lateral plasma coupling generated between the first metal portion 51 and the second metal portion 52, such that light generated by the organic material layer 4 at the first emitting region 41 has a gain in a first waveband, or a peak wavelength of the light generated by the first emitting region 41 shifts to the first waveband. The peak wavelength is defined by the wavelength between two adjacent wave peaks, and the first waveband is from 400 nm to 750 nm.

The light produced by the first emitting region 41 directly passes through the electrode layer 2 and the substrate 1 beneath, or is reflected by the second metal layer 3 before passing through the electrode layer 2 and the substrate 1. Possibly, the light moving upward passes through the second metal layer 3 as the second metal layer 3 is translucent or the second metal layer 3 is thin enough to be translucent. As for the light produced outside the first emitting region 41, it can pass through the first metal layer 5, the electrode layer 2 and the substrate 1 beneath, or it can be reflected by the second metal layer 3 before passing through the first metal layer 5, the electrode layer 2 and the substrate 1. Alternatively, as the second metal layer 3 is translucent or thin enough to be translucent, the light can directly pass through the second metal layer 3. Otherwise, both the first metal layer 5 and the second metal layer 3 can be opaque or thick enough, to block the light produced outside the first emitting region 41.

When a voltage is applied between the electrode layer 2 and the second metal layer 3 such that the organic material layer 4 produces light, by adjusting the lateral distance D and the period Λ, the light from the organic material layer 4 will have a gain in a first waveband (e.g., red-light, green-light or blue-light waveband) due to the lateral plasma coupling between the first metal portion 51 and the second metal portion 52. In an embodiment, the peak wavelength (longer wavelength) of the light having the gain is greater than the peak wavelength of light generated by the organic material layer 4, or the peak wavelength of the shifted light is greater than light generated by the organic material layer 4. In another embodiment, the peak wavelength (shorter wavelength) of the light having the gain is less than the peak wavelength of light generated by the organic material layer 4, or the peak wavelength of the shifted light is less than light generated by the organic material layer 4. The lateral distance of blue light (shorter wavelength) having the gain is less than the lateral distance of red light (longer wavelength) with the gain; the period of blue light (shorter wavelength) having the gain is less than the period of red light (longer wavelength) with the gain.

As shown in FIG. 1A, the light emitting device comprising a first emitting region 41 is capable of emitting light in a waveband, such as blue light, red light, green light, gained blue light, gained red light, or gained green light. As the light outside the first emitting region 41 can pass through the upper side or the lower side, or pass through both the upper and lower sides at the same time, in the embodiment there will be the light originally produced by the organic material layer 4 in addition to the light of the first waveband, i.e., there will be lights of two wavebands.

Figure 1B:
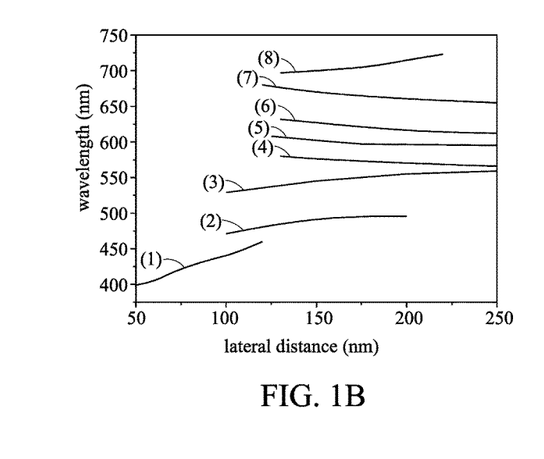
FIG. 1B illustrates relationships between periods, lateral distances and wavelengths of the metal portions of a light emitting device according to the first embodiment of the present disclosure.

Refer to FIG. 1B illustrating relationships between periods, lateral distances and wavelengths of the metal portions of light emitting device according to the first embodiment of the present disclosure. The relationship between the period Λ and lateral distance D of the first metal portion 51 and the second metal portion 52, and the gained waveband is shown in FIG. 1B. FIG. 1B shows the relationships between the period Λ, the lateral distance D and the shifted peak wavelength of the light generated by the first emitting region. In an embodiment, the height of the first metal portion 51 and second metal portion 52 is approximately 30 nm.

As indicated by line (1) with a period of 200 nm and a lateral distance of about 50 nm to 120 nm, the gained waveband of the first emitting region is approximately from 399 nm to 460 nm; or the peak wavelength of the light from the first emitting region is shifted to between 399 nm and 460 nm.

As indicated by line (2) with a period of 250 nm and a lateral distance of about 100 nm to 200 nm, the gained waveband of the first emitting region is approximately from 471 nm to 496 nm; or the peak wavelength of the light from the first emitting region is shifted to between 471 nm and 496 nm.

As indicated by line (3) with a period of 300 nm and a lateral distance of about 100 nm to 250 nm, the gained waveband of the first emitting region is approximately from 529 nm to 580 nm; or the peak wavelength of the light from the first emitting region is shifted to between 529 nm and 580 nm.

As indicated by line (4) with a period of 350 nm and a lateral distance of about 130 nm to 250 nm, the gained waveband of the first emitting region is approximately from 566 nm to 580 nm; or the peak wavelength of the light from the first emitting region is shifted to between 566 nm and 580 nm.

As indicated by line (5) with a period of 400 nm and a lateral distance of about 125 nm to 250 nm, the gained waveband of the first emitting region is approximately from 595 nm to 607 nm; or the peak wavelength of the light from the first emitting region is shifted to between 595 nm and 607 nm.

As indicated by line (6) with a period of 450 nm and a lateral distance of about 130 nm to 250 nm, the gained waveband of the first emitting region is approximately from 612 nm to 632 nm; or the peak wavelength of the light from the first emitting region is shifted to between 612 nm and 632 nm.

As indicated by line (7) with a period of 500 nm and a lateral distance of about 125 nm to 250 nm, the gained waveband of the first emitting region is approximately from 655 nm to 680 nm; or the peak wavelength of the light from the first emitting region is shifted to between 655 nm and 680 nm.

As indicated by line (8) with a period of 550 nm and a lateral distance of about 130 nm to 220 nm, the gained waveband of the first emitting region is approximately from 697 nm to 723 nm; or the peak wavelength of the light from the first emitting region is shifted to between 697 nm and 723 nm.

In an embodiment, as the period $\Lambda$ is approximately 550 nm and the lateral distance D is approximately 130 nm, a gain will be generated around red-light waveband of 723 nm. Therefore, adjusting period $\Lambda$ and lateral distance D generates a gain for light of different wavebands, or shifts the peak wavelength of light to different wavebands.

Figure 1C:
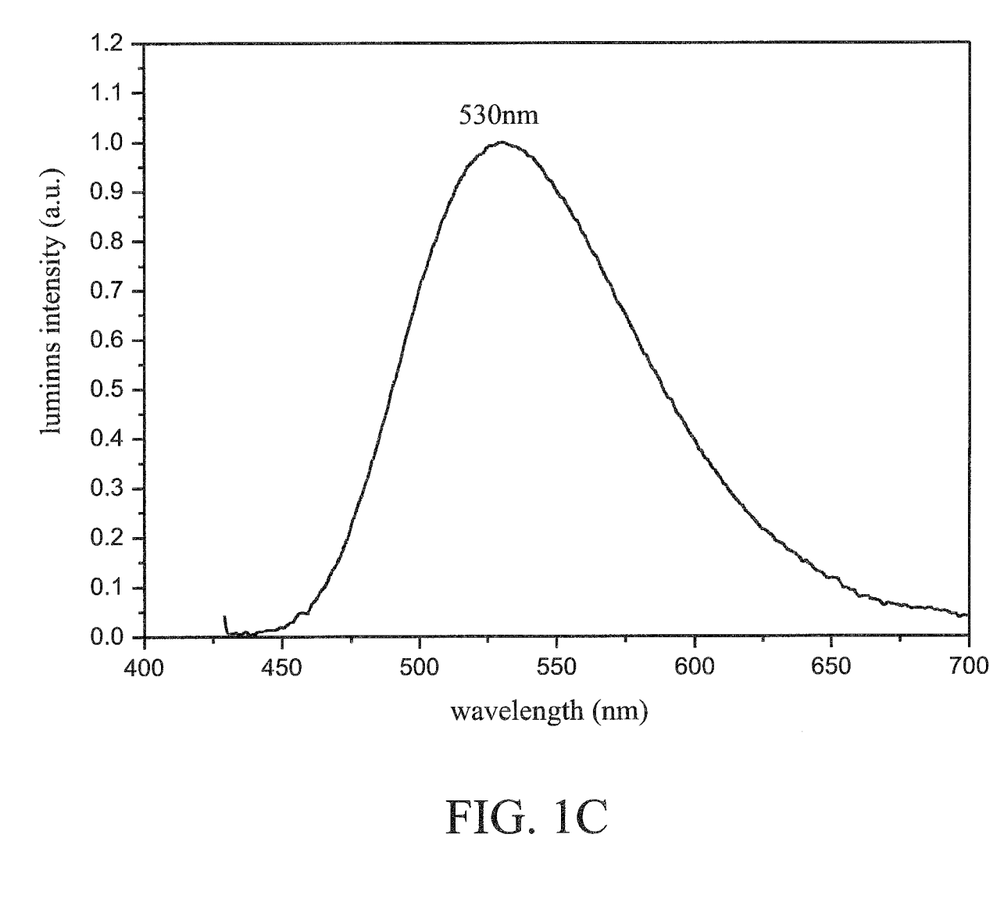
FIG. 1C shows an example of the spectrum of the light from the organic material layer according to the present disclosure.
Figure 1D:
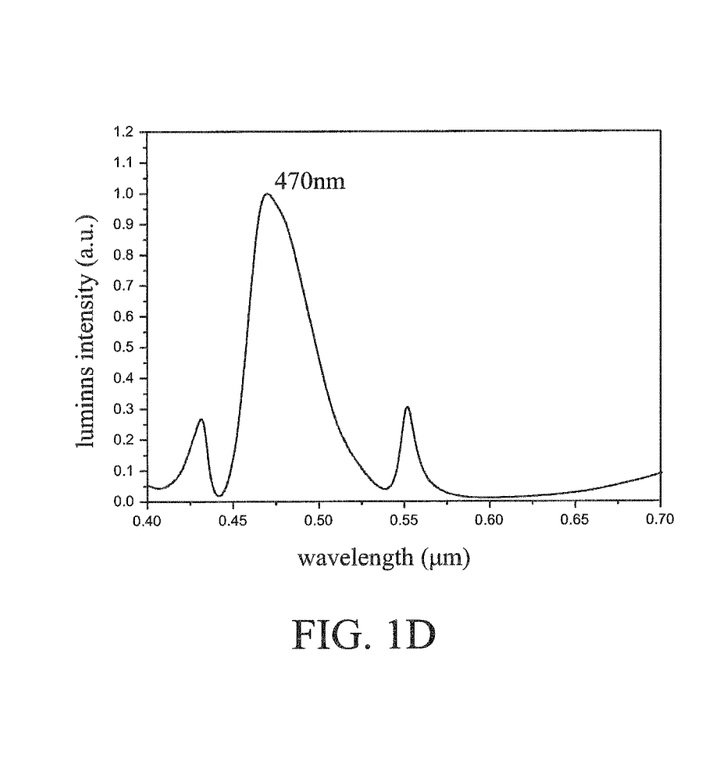
FIGS. 1D and 1E are graphs showing the wave peak shift and the luminous intensity of a light emitting device according to the present disclosure.
Figure 1E:
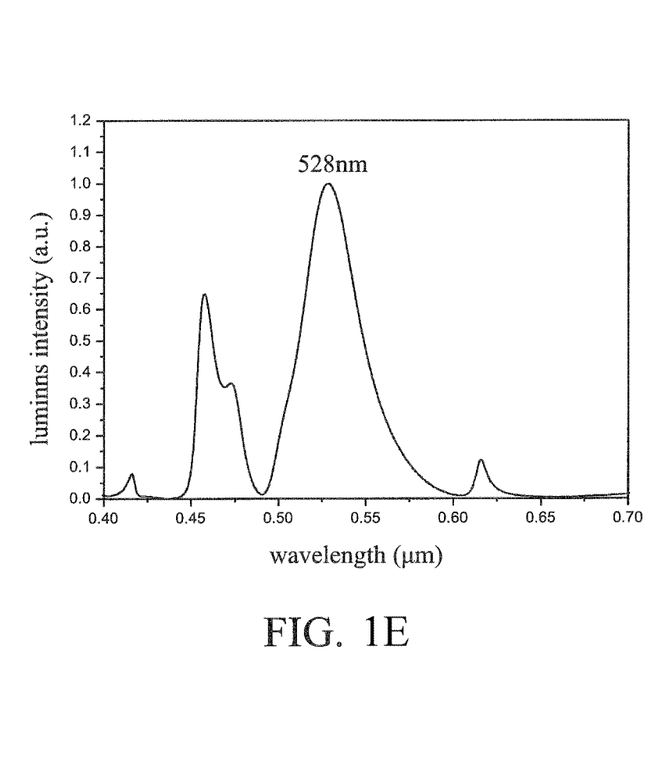
Figure 1F:
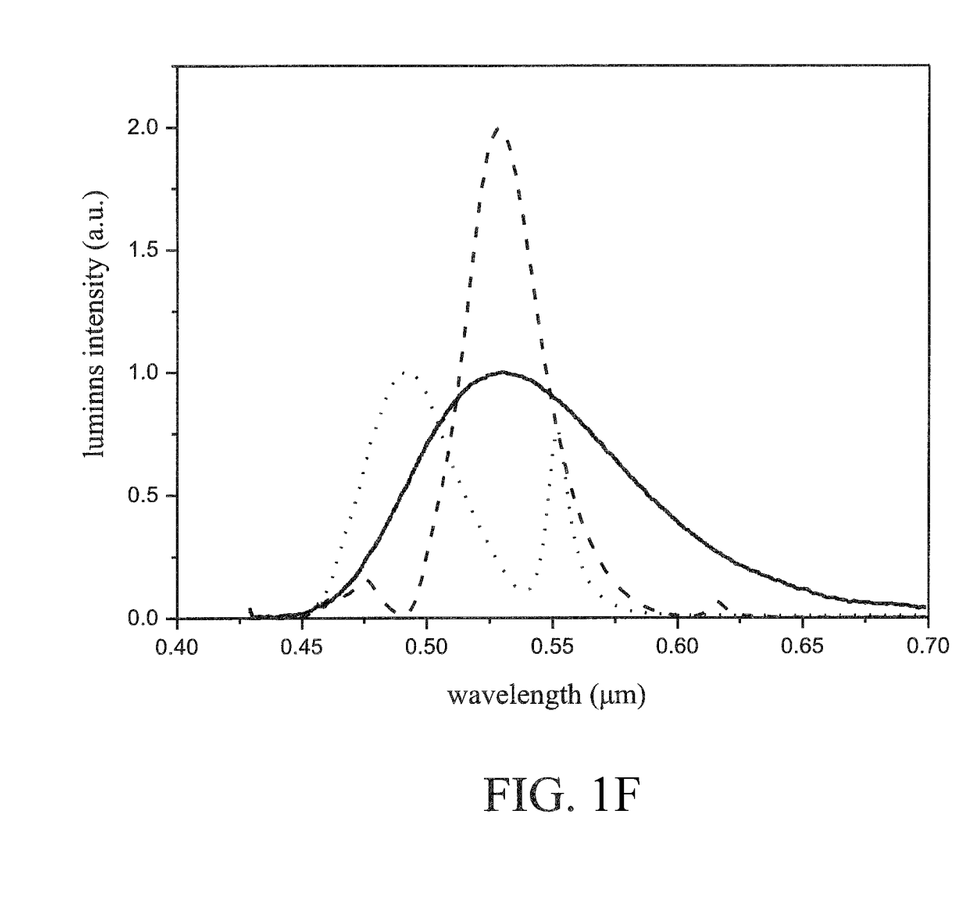
FIG. 1F illustrates a graph of spectrum, wave peak shift and luminous intensity gain of an organic material layer of a light emitting device according to the present disclosure.

Refer to FIGS. 1C to 1D. FIG. 1C shows an example of the spectrum of the light from the organic material layer, and FIGS. 1D and 1E are graphs showing the wave peak shift and the luminous intensity of light emitting device. In an experimental embodiment, an organic material layer has organic green-light material $Alq_3$, which has a photoluminescence (PL) peak wavelength of 530 nm and a full width at half maximum (FWHM) of 100 nm. As the first metal portion and second metal portion have a period of 250 nm and a lateral distance of 120 nm, the peak wavelength of the light from the organic material layer shifts to 470 nm, as indicated in FIG. 1D. As the first metal portion and second metal portion have a period of 300 nm and a lateral distance of 120 nm, the peak wavelength of the light from the organic material layer shifts to 528 nm, as indicated in FIG. 1E. Refer to FIG. 1F illustrating a graph of spectrum, wave peak shift and luminous intensity gain of organic material layer of a light emitting device according to the present disclosure. In FIG. 1F, the peak wavelength of organic green-light material $Alq_3$ at PL is approximately 530 nm, the FWHM is approximately 100 nm in the experiment as indicated by solid line, and the results after the PL X transmission for the metal portions separated by lateral distances are presented. It is shown that as the metal portions have a period of 250 nm and a lateral distance of 120 nm, the peak wavelength shifts to 488 nm from 530 nm due to the plasma coupling between the metal portions, as indicated by dotted line, i.e., the peak wavelength shifting from green-light waveband to blue-light waveband, also known as blue shift. As the metal portions have a period of 300 nm and a lateral distance of 120 nm, FWHM of the peak wavelength decreases from 100 nm to 38 nm, as indicated by dashed line, showing that the energy is concentrated, and an estimated quality factor, i.e., Q-factor ($\lambda/\Delta\lambda$) is doubled compared to original factor of $Alq_3$, meaning a gain is generated.

In addition to the lateral plasma coupling between the first metal portion 51 and second metal portion 52, a vertical plasma coupling is further generated between the second metal layer 3 and the first metal portion 51, or between the second metal layer 3 and the second metal portion 52.

In an embodiment, the organic material layer 4 is sandwiched between the first metal layer 5 and the second metal layer 3. The first metal portion 51 and the second metal layer 3 are separated from each other at a first vertical distance for a vertical plasma coupling to be generated between the first metal portion 51 and the second metal layer 3, such that a peak wavelength of a light generated by the organic material layer 4 between the first metal portion 51 and the second metal layer 3 shifts to an $A^{th}$ waveband.

To be more specific, the first metal portion 51 having a thickness is separated from the second metal layer 3 by a vertical distance. The vertical distance between the first metal portion 51 and the second metal layer 3 enables a vertical plasma coupling to be generated between the first metal portion 51 and the second metal layer 3, such that the organic material layer 4 between the first metal portion 51 and the second metal layer 3 emits light having a peak wavelength shifting to the $A^{th}$ waveband. In another embodiment, the second metal portion 52 having a thickness is separated from the second metal layer 3 by a vertical distance. The vertical distance between the second metal portion 52 and the second metal layer 3 enables a vertical plasma coupling to be generated between the second metal portion 52 and the second metal layer 3, such that the organic material layer 4 between the second metal portion 52 and the second metal layer 3 emits light having a peak wavelength shifting to the $B^{th}$ waveband.

The thickness of the first metal portion 51 or the second metal portion 52 can be adjusted between 5 nm and 20 nm, and the vertical distance from the second metal layer 3 to the first metal portion 51 or to the second metal portion 52 can be adjusted between 75 nm and 130 nm. As the thickness of the first metal portion 51 or the second metal portion 52 increases and the vertical distance with the second metal layer 3 decreases, the peak wavelength of the light from the organic material layer 4 shifts toward blue-light waveband (shift toward short waveband). As the thickness of the first metal portion 51 or the second metal portion 52 decreases and the vertical distance with the second metal layer 3 increases, the peak wavelength of the light from the organic material layer 4 shifts toward red-light waveband (shift toward long waveband). In an embodiment, the lateral distance D between the first metal portion 51 and the second metal portion 52 is blue shift distance, the vertical distance between the first metal portion 51 and the second metal layer 3 is red shift distance, and the vertical distance between the second metal portion 52 and the second metal layer 3 is green gain distance. In another embodiment, the lateral distance D between the first metal portion 51 and the second metal portion 52 is red shift distance, the vertical distance between the first metal portion 51 and the second metal layer 3 is blue shift distance, and the vertical distance between the second metal portion 52 and the second metal layer 3 is green gain distance. In yet another embodiment, the lateral distance D between the first metal portion 51 and the second metal portion 52 is green gain distance, the vertical distance between the first metal portion 51 and the second metal layer 3 is blue shift distance, and the vertical distance between the second metal portion 52 and the second metal layer 3 is red shift distance. As a result, the light emitting device emits light constituted by blue light, red light and green light.

In an embodiment, as a peak wavelength of light generated by an emitting region that separates two metal portions shifts toward blue-light waveband because of the lateral distance between the two metal portions, the lateral distance is called blue shift distance. As a peak wavelength of light generated by an emitting region that separates two metal portions shifts toward red-light waveband because of the lateral distance between the two metal portions, the lateral distance is called red shift distance. As a gain is generated for the light from the organic material layer due to the lateral distance between the two metal portions, the lateral distance is called gain distance.

Second Embodiment

The second embodiment differs from the first embodiment in that in the second embodiment the first metal layer further comprises a third metal portion, the organic material layer further comprises a second light emitting region separating the second metal portion and the third metal portion, the second metal portion and the third metal portion have a second period, the second metal portion and the second metal portion are separated by a second lateral distance, the second period and the second lateral distance enable a lateral plasma coupling generated between the second metal portion and the third metal portion, such that light generated by the organic material layer at the second emitting region has a gain in a second waveband, or a peak wavelength of the light generated by the second emitting region shifts to the second waveband.

Figure 2:
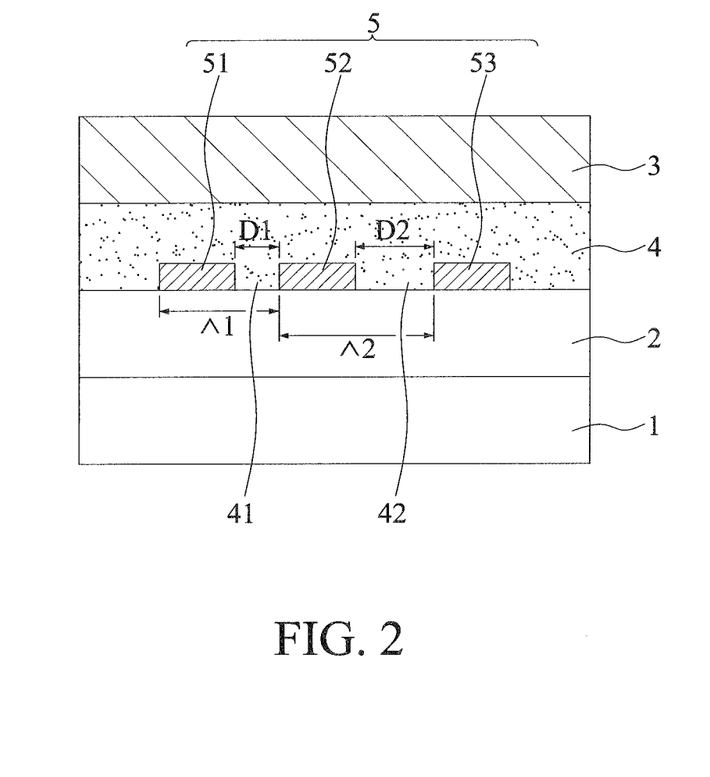
FIG. 2 is a schematic cross-sectional view of a light emitting device according to a second embodiment of the present disclosure.

Refer to FIG. 2 showing a schematic cross-sectional view of a light emitting device according to a second embodiment of the present disclosure. The second embodiment differs from the first embodiment in that in the second embodiment the first metal layer 5 comprises a first metal portion 51, a second metal portion 52 and a third metal portion 53 separated from one another; the organic material layer 4 comprises a first emitting region 41 separating the first metal portion 51 and the second metal portion 52, and a second emitting region 42 separating the second metal portion 52 and the third metal portion 53. The width of the first emitting region 41 is the lateral distance D1 between the first metal portion 51 and the second metal portion 52, and the first metal portion 51 and the second metal portion 52 have a period Λ1, and the period Λ1 and the lateral distance D1 enable a lateral plasma coupling to be generated between the first metal portion 51 and the second metal portion 52, such that light generated by the first emitting region 41 has a gain in a first waveband, or a peak wavelength of the light generated by the first emitting region 41 shifts to the first waveband. The width of the second emitting region 42 is the lateral distance D2 between the second metal portion 52 and the third metal portion 53, and the second metal portion 52 and the third metal portion 53 have a period Λ2, and the period Λ2 and the lateral distance D2 enable a lateral plasma coupling to be generated between the second metal portion 52 and the third metal portion 53, such that light generated by the second emitting region 42 has a gain in a second waveband, or a peak wavelength of the light generated by the second emitting region 42 shifts to the second waveband.

In an embodiment, adjusting the lateral distance D1 and the period Λ1 results in the generation of a gain in blue-light waveband, or causes the first emitting region 41 to emit blue light. In another embodiment, adjusting the lateral distance D2 and the period Λ2 results in the generation of a gain in red-light waveband, or causes the second emitting region 42 to emit red light. Further, the lateral distance D1 is less than the lateral distance D2, and the period Λ1 is less than the period Λ2. The dimensions of lateral distances D1 and D2 and periods Λ1 and Λ2 can be referred to FIG. 1B.

The light emitting device shown in FIG. 2 comprising the first emitting region 41 and the second emitting region 42 is capable of emitting lights of two wavebands, such as gained blue light and gained red light. If the light outside the first emitting region 41 and the second emitting region 42 is able to pass through, there will be lights from three wavebands, so as to constitute white light. Moreover, if the light emitted from the organic material layer 4 includes blue-light waveband and red-light waveband, and has a peak wavelength located within green-light waveband, the light emitting device emits white light constituted by red light, green light, and blue light. As such, the light from non-blue light organic material layer can shift to blue-light waveband without using any blue organic material layer in light emitting device.

In addition to the lateral plasma coupling generated between the first metal portion 51 and the second metal portion 52, and between the second metal portion 52 and the third metal portion 53, a vertical plasma coupling is further generated between the second metal layer 3 and any of the first metal portion 51, the second metal portion 52 and the third metal portion 53.

In an embodiment, as at least one of the first metal portion 51, the second metal portion 52 and the third metal portion 53 has a thickness and is separated from the second metal layer 3 by a vertical distance, the vertical distance enables a vertical plasma coupling to be generated between the second metal layer 3 and the at least one of the first metal portion 51, the second metal portion 52 and the third metal portion 53, such that a peak wavelength of the light generated by the organic material layer 4 between the second metal layer 3 and any or at least one of the first metal portion 51, the second metal portion 52 and the third metal portion 53 shifts to a $C^{th}$ waveband.

The thickness of the first metal portion 51, the second metal portion 52 or the third metal portion 53 can be adjusted between 5 nm and 20 nm, and the vertical distance from the second metal layer 3 to the first metal portion 51, the second metal portion 52 or the third metal portion 53 can be adjusted between 75 nm and 130 nm. As the thickness of the first metal portion 51, the second metal portion 52 or the third metal portion 53 increases and the vertical distance with the second metal layer 3 decreases, the peak wavelength of the light from the organic material layer 4 shifts toward blue-light waveband. As the thickness of the first metal portion 51, the second metal portion 52 or the third metal portion 53 decreases and the vertical distance with the second metal layer 3 increases, the peak wavelength of the light from the organic material layer 4 shifts toward red-light waveband.

In an embodiment, the lateral distance between the first metal portion 51 and the second metal portion 52 is blue shift distance, the lateral distance between the second metal portion 52 and the third metal portion 53 is red shift distance, and the vertical distance from the second metal layer 3 to at least one of the first metal portion 51, the second metal portion 52 and the third metal portion 53 is green gain distance. In another embodiment, the lateral distance between the first metal portion 51 and the second metal portion 52 is blue shift distance, the lateral distance between the second metal portion 52 and the third metal portion 53 is green gain distance, and the vertical distance from the second metal layer 3 to at least one of the first metal portion 51, the second metal portion 52 and the third metal portion 53 is red shift distance. In yet another embodiment, the lateral distance between the first metal portion 51 and the second metal portion 52 is green gain distance, the lateral distance between the second metal portion 52 and the third metal portion 53 is red shift distance, and the vertical distance from the second metal layer 3 to at least one of the first metal portion 51, the second metal portion 52 and the third metal portion 53 is blue shift distance. As a result, the light emitting device emits light constituted by blue light, red light and green light.

Third Embodiment

The third embodiment differs from the second embodiment in that in the third embodiment the first metal layer further comprises a fourth metal portion, the organic material layer further comprises a third emitting region separating the third metal portion and the fourth metal portion, and the third metal portion and the fourth metal portion have a third period and are separated from each other by a third lateral distance. The third period and the third lateral distance enable a lateral plasma coupling generated between the third metal portion and the fourth metal portion, such that light generated by the organic material layer at the third emitting region has a gain in a third waveband, or a peak wavelength of the light generated by the third emitting region shifts to the third waveband.

Figure 3:
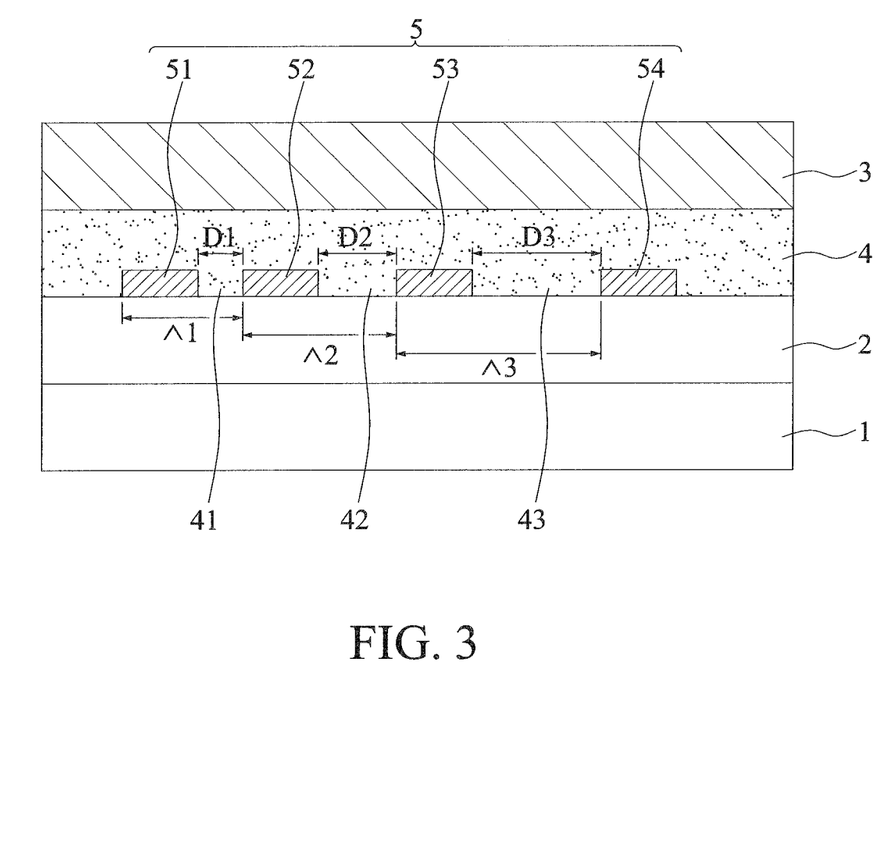
FIG. 3 is a schematic cross-sectional view of a light emitting device according to a third embodiment of the present disclosure.

Refer to FIG. 3 showing a schematic cross-sectional view of a light emitting device according to a third embodiment of the present disclosure. Third embodiment differs from the second embodiment in that in the third embodiment the first metal layer 5 comprises a first metal portion 51, a second metal portion 52, a third metal portion 53 and a fourth metal portion 54 separated from one another, and the organic material layer 4 comprises a first emitting region 41 separating the first metal portion 51 and the second metal portion 52, a second emitting region 42 separating the second metal portion 52 and the third metal portion 53, and a third emitting region 43 separating the third metal portion 53 and the fourth metal portion 54.

The width of the first emitting region 41 is the lateral distance D1 between the first metal portion 51 and the second metal portion 52, the first metal portion 51 and the second metal portion 52 have a period Λ1, and the period Λ1 and the lateral distance D1 enable a lateral plasma coupling to be generated between the first metal portion 51 and the second metal portion 52, such that light generated by the first emitting region 41 has a gain in a first waveband, or a peak wavelength of the light generated by the first emitting region 41 shifts to the first waveband. The width of the second emitting region 42 is the lateral distance D2 between the second metal portion 52 and the third metal portion 53, the second metal portion 52 and the third metal portion 53 have a period Λ2, and the period Λ2 and the lateral distance D2 enable a lateral plasma coupling to be generated between the second metal portion 52 and the third metal portion 53, such that light generated by the second emitting region 42 has a gain in a second waveband, or a peak wavelength of the light generated by the second emitting region 42 shifts to the second waveband. The width of the third emitting region 43 is the lateral distance D3 between the third metal portion 53 and the fourth metal portion 54, the third metal portion 53 and the fourth metal portion 54 have a period Λ3, and the period Λ3 and the lateral distance D3 enable a lateral plasma coupling to be generated between the third metal portion 53 and the fourth metal portion 54, such that light generated by the third emitting region 43 has a gain in a third waveband, or a peak wavelength of the light generated by the third emitting region 43 shifts to the third waveband.

In an embodiment, adjusting the lateral distance D1 and the period Λ1 results in the generation of a gain in blue-light waveband or a shift to blue-light waveband, and causes the first emitting region 41 to emit blue light. In another embodiment, adjusting the lateral distance D2 and the period Λ2 results in the generation of a gain in green-light waveband or a shift to green-light waveband, and causes the second emitting region 42 to emit red light. In yet another embodiment, adjusting the lateral distance D3 and the period Λ3 results in the generation of a gain in red-light waveband or a shift to red-light waveband, and causes the third emitting region 43 to emit red light. The lateral distance D1 is less than the lateral distance D2, and the lateral distance D2 is less than the lateral distance D3. The period Λ1 is less than the period Λ2, and the period Λ2 is less than the period Λ3. The dimensions of lateral distances D1 to D3 and periods Λ1 to Λ3 can be referred to FIG. 1B.

The light emitting device shown in FIG. 3 comprising the first emitting region 41, the second emitting region 42 and the third emitting region 43 is capable of emitting three different lights, such as blue light, green light and red light, to constitute white light.

In accordance with the first embodiment to the third embodiment as illustrated in FIGS. 1A to 3, respectively, the light emitting device according to the present disclosure comprises an electrode layer, a first metal layer, an organic material layer and a second metal layer sequentially stacked on a substrate. When a voltage is applied to the light emitting device, the light emitting device produces red light, green light, blue light or gained red light, gained green light, gained blue light, or white light constituted by the aforementioned lights.

Furthermore, the first metal portion 51, the second metal portion 52, the third metal portion 53 and the fourth metal layer 54 can be formed by patterning the first metal layer 5 to create openings (not shown) to separate the first metal portion 51, the second metal portion 52, the third metal portion 53 and the fourth metal layer 54. In an embodiment, the separated and individual metal portions can be formed on the electrode layer 2 by deposition. In another embodiment, metal particles are to be directly disposed on the electrode layer 2. The metal particles can be round, oval or other shapes.

Tables 1 to 3 provide experimental data regarding vertical plasma coupling according to the above embodiments, showing relationship between the peak wavelength (unit: nm) of light, the thickness $D_2$ of metal portions (unit: nm), and vertical distance $D_1$ between the metal portions and the second metal layer (unit: nm), after vertical plasma coupling. In an embodiment, the materials used in Tables 1 to 3 for the metal portions and the second metal layer are Al/Al, Ag/Ag, and Au/Au, respectively, and the light produced by the organic material layer has a peak wavelength located around 530 nm when a voltage is applied to the light emitting device.

TABLE 1

| $D_2$ | $D_1$ | | | | | | | | | | | | | |
|---|---|---|---|---|---|---|---|---|---|---|---|---|---|---|
| | 75 | 80 | 85 | 90 | 95 | 100 | 105 | 110 | 115 | 120 | 125 | 130 | 140 | 150 |
| 5 | 413 | 420 | 473 | 492 | 512 | 530 | 548 | | 566 | 584 | 602 | 619 | 637 | 674 | 712 |
| 10 | 413 | 432 | 445 | 458 | 473 | 488 | 504 | | 519 | 535 | 551 | 567 | 583 | 616 | 649 |
| 15 | 376 | 425 | 438 | 450 | 462 | 476 | 491 | | 506 | 521 | 536 | 552 | 567 | 599 | 632 |
| 20 | 374 | 422 | 435 | 446 | 457 | 471 | 485 | | 500 | 515 | 530 | 546 | 561 | 593 | 625 |

TABLE 2

| $D_2$ | $D_1$ | | | | | | | | | | | | | |
|---|---|---|---|---|---|---|---|---|---|---|---|---|---|---|
| | 75 | 80 | 85 | 90 | 95 | 100 | 105 | 110 | 115 | 120 | 125 | 130 | 140 | 150 |
| 10 | 462 | 492 | 513 | 531 | 544 | 567 | 594 | 621 | 629 | 645 | 658 | 673 | 711 | 740 |
| 15 | 466 | 484 | 502 | 517 | 533 | 547 | 565 | 582 | 600 | 616 | 632 | 647 | 678 | 711 |
| 20 | 463 | 478 | 493 | 508 | 523 | 538 | 553 | 568 | 584 | 600 | 616 | 632 | 662 | 693 |

TABLE 3

| $D_2$ | $D_1$ | | | | | | | | | | | | | |
|---|---|---|---|---|---|---|---|---|---|---|---|---|---|---|
| | 75 | 80 | 85 | 90 | 95 | 100 | 105 | 110 | 115 | 120 | 125 | 130 | 140 | 150 |
| 10 | 480 | 480 | 479 | 523 | 559 | 573 | 591 | 607 | 673 | 684 | 696 | 708 | 735 | 762 |
| 15 | 515 | 526 | 535 | 548 | 559 | 572 | 591 | 609 | 652 | 665 | 675 | 685 | 707 | 732 |
| 20 | 518 | 526 | 535 | 545 | 555 | 567 | 584 | 603 | 652 | 652 | 663 | 673 | 693 | 716 |

According to Tables 1 to 3, the metal portions have thickness between 5 nm and 20 nm, and are separated from the second metal layer at a vertical distance between 75 nm and 150 nm. For example, referring to Table 1, as the thickness of the metal portions is 20 nm and the vertical distance from the second metal layer is 90 nm, the organic material layer produces light having a peak wavelength 446 nm, i.e., blue light being generated. As the thickness of the metal portions is 5 nm and the vertical distance from the second metal layer is 140 nm, the organic material layer produces light having peak wavelength 674 nm, i.e., red light being generated.

As such, as the thickness of the metal portions increases and the vertical distance with the second metal layer decreases, the peak wavelength of the light shifts toward blue-light waveband (also called blue shift) due to the vertical plasma coupling; otherwise, as the thickness of the metal portions decreases and the vertical distance with the second metal layer increases, the peak wavelength of the light shifts toward red-light waveband (also called red shift) due to the vertical plasma coupling.

Fourth Embodiment

The light emitting device of the fourth embodiment comprises an electrode layer, a metal layer and an organic material layer. The metal layer is disposed above the electrode layer. The organic material layer is disposed between the electrode layer and the metal layer, and comprises a first emitting portion protruding into the metal layer. The metal layer comprises a first metal region and a second metal region that are separated by the first emitting portion. The first metal region and the second metal region have a first period, and are separated from each other by a first lateral distance. The first period and the first lateral distance enable a lateral plasma coupling generated between the first metal region and the second metal region, such that light generated by the organic material layer at the first emitting portion has a gain in a first waveband, or a peak wavelength of the light generated by the first emitting portion shifts to the first waveband.

Figure 4:
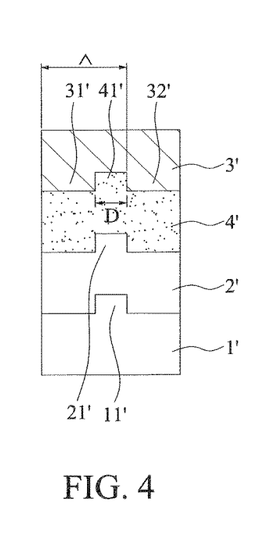
FIG. 4 is a schematic cross-sectional view of a light emitting device according to a fourth embodiment of the present disclosure.

Refer to FIG. 4 showing a schematic cross-sectional view of a light emitting device according to the fourth embodiment of the present disclosure. The light emitting device comprises a substrate 1', and an electrode layer 2', an organic material layer 4' and a metal layer 3' sequentially stacked on the substrate 1'.

The substrate 1' is made of, for example, glass or transparent plastic.

The electrode layer 2' can be a transparent conductive film, such as Iridium Tin Oxide (ITO), coated on the substrate 1' and generally serves as an anode. When a voltage is applied, the holes injected from the electrode layer 2' enter the organic material layer 4'.

The metal layer 3' contains material such as metal material and usually serves as a cathode. When voltage is applied, the electrons injected from the metal layer 3' enter the organic material layer 4'. The metal layer 3' can change the path of the light projected thereon as the material or the thickness of the metal layer 3 varies. For example, the metal layer containing metal can reflect light, nano metal wires can allow light to pass through, a thin metal layer can be translucent, or a thick metal layer can be opaque.

The organic material layer 4' comprises a first emitting portion 41' protruding into the metal layer 3'. The metal layer 3' comprises a first metal region 31' and a second metal region 32' that are separated by the first emitting portion 41'. The organic material layer 4' can act as a hole transfer/injection layer, an emitting layer, or an electron transfer/injection layer. The emitting layer can comprise a hole transport material and an electron transport material that can interact with each other to generate exciplexes. A spectrum of the light generated by the organic material layer 4' can cover full spectra of visible lights, approximately from 400 nm to 750 nm. The first emitting portion 41' has a width that is the lateral distance D between the first metal region 31' and the second metal region 32'. And the first metal region 31' and the second metal region 32' have a period Λ. The period Λ and the lateral distance D are configured to enable a lateral plasma coupling generated in the first metal region 31' and the second metal region 32', such that light generated by the organic material layer 4' at the first emitting portion 41' has a gain in a first waveband, or a peak wavelength of the light generated by the first emitting portion 41' shifts to the first waveband.

The light produced by the first emitting portion 41' directly passes through the electrode layer 2' and the substrate 1' beneath, or is reflected by the metal layer 3' before passing through the electrode layer 2' and the substrate 1'. Possibly, the light moving upward passes through the metal layer 3' as the metal layer 3' is translucent or the metal layer 3 is thin enough to be translucent. As for the light produced outside the first emitting portion 41', it can pass through the electrode layer 2' and the substrate 1' beneath, or it can be reflected by the metal layer 3' before passing through the electrode layer 2' and the substrate 1'. In an embodiment, as the metal layer 3' is translucent or thin enough to be translucent, the light can directly pass through the metal layer 3' above. Otherwise, the metal layer 3' can be opaque or thick enough, to block the light produced outside the first emitting portion 41'.

When a voltage is applied between the electrode layer 2' and the metal layer 3' such that the organic material layer 4' produces light, in different embodiment, by controlling the lateral distance D and the period $\Lambda$, the light from the organic material layer 4' will have a gain in red-light, green-light or blue-light waveband, causing the first emitting portion 41' to emit light in blue-light, green-light or red-light waveband.

Both the period $\Lambda$ and the lateral distance D increase in accordance with the sequence of blue light gain, green light gain and red light gain herein, i.e., the lateral distance for blue light gain being less than that of green light gain, the lateral distance for green light gain being less than that of red light gain, the period for blue light gain being less than that of green light gain, and the period for green light gain being less than that of red light gain. The dimensions for the lateral distance D and period $\Lambda$ can be referred to FIG. 1B, and the shifts and gains of peak wavelength can be referred to FIGS. 1D and 1E.

The light emitting device shown in FIG. 4 comprising a first emitting portion 41' is capable of emitting light of one waveband, such as blue light, red light, or green light, or gained blue light, gained red light, or gained green light; and if the light outside the first emitting portion 41' is able to pass through in addition to the light originally emitted by the first emitting portion 41', light with two wavebands is produced.

Fifth Embodiment

The fifth embodiment differs from the fourth embodiment in that in the fifth embodiment the organic material layer further comprises a second emitting portion protruding into the metal layer, the metal layer further comprises a third metal region separated from the second metal region by the second emitting portion, the second metal region and the third metal region have a second period and are separated from each other by a second lateral distance, and the second period and the second lateral distance enable a lateral plasma coupling generated between the second metal region and the third metal region, such that light generated by the organic material layer at the second emitting portion has a gain in a second waveband, or a peak wavelength of the light generated by the second emitting portion shifts to the second waveband.

Figure 5:
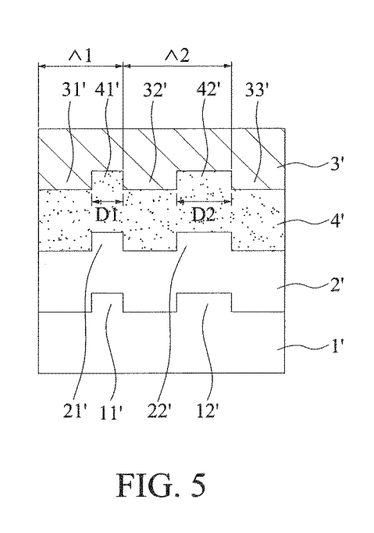
FIG. 5 is a schematic cross-sectional view of a light emitting device according to a fifth embodiment of the present disclosure.

Refer to FIG. 5 showing a schematic cross-sectional view of a light emitting device according to a fifth embodiment of the present disclosure. The fifth embodiment differs from the fourth embodiment in that in the fifth embodiment the organic material layer 4' comprises a first emitting portion 41' and a second emitting portion 42' protruding into the metal layer 3', and the metal layer 3' comprises a first metal region 31', a second metal region 32', and a third metal region 33' that are separated by the first emitting portion 41' and the second emitting portion 42'. The width of the first emitting portion 41' is the lateral distance D1 between the first metal region 31' and the second metal region 32', and the first metal region 31' and the second metal region 32' have a period $\Lambda 1$. The period $\Lambda 1$ and the lateral distance D1 are configured to enable a lateral plasma coupling generated in the first metal region 31' and the second metal region 32', such that light generated by the organic material layer 4' has a gain in a first waveband, or a peak wavelength of the light generated by the first emitting portion 41' shifts to the first waveband. The width of the second emitting portion 42' is the lateral distance D2 between the second metal region 32' and the third metal region 33', and the second metal region 32' and the third metal region 33' have a period $\Lambda 2$. The period $\Lambda 2$ and the lateral distance D2 are configured to enable a lateral plasma coupling generated in the second metal region 32' and the third metal region 33', such that light generated by the organic material layer 4' has a gain in a second waveband, or a peak wavelength of the light generated by the second emitting portion 42' shifts to the second waveband.

In an embodiment, adjusting the lateral distance D1 and the period $\Lambda 1$ results in the generation of a gain to the light of the organic material layer 4' in blue-light waveband or causes the first emitting portion 41' to emit blue light. In another embodiment, adjusting the lateral distance D2 and the period $\Lambda 2$ results in the generation of a gain to the light of the organic material layer 4' in red-light waveband or causes the second emitting portion 42' to emit red light. The lateral distance D1 is less than the lateral distance D2, and the period $\Lambda 1$ is less than the period $\Lambda 2$. The dimensions of lateral distances D1 and D2, and periods $\Lambda 1$ and $\Lambda 2$ can be referred to FIG. 1B. The shifts and gains of peak wavelength of light from the organic material layer are indicated in FIGS. 1D and 1E.

The light emitting device shown in FIG. 5 comprising the first emitting portion 41' and the second emitting portion 42' is capable of emitting lights of two wavebands, such as blue light and red light. If the light outside the first emitting portion 41' and the second emitting portion 42' is able to pass through, there will be light of three wavebands. Specifically, the light emitted from the organic material layer 4' includes light in blue-light waveband and light in red-light waveband, and its peak wavelength is located within green-light waveband, the light emitting device emits white light constituted by red light, green light, and blue light without using any blue organic material layer.

Sixth Embodiment

The sixth embodiment differs from the fifth embodiment in that in the sixth embodiment the organic material layer further comprises a third emitting portion protruding into the metal layer, the metal layer comprises a fourth metal region separated from the third metal region by the third emitting portion, the third metal region and the fourth metal region have a third period and are separated from each other by a third lateral distance, and the third period and the third lateral distance enable a lateral plasma coupling generated between the third metal region and the fourth metal region, such that a light generated by the organic material layer at the third emitting portion has a gain in a third waveband, or a peak wavelength of the light generated by the third emitting portion shifts to the third waveband.

Figure 6:
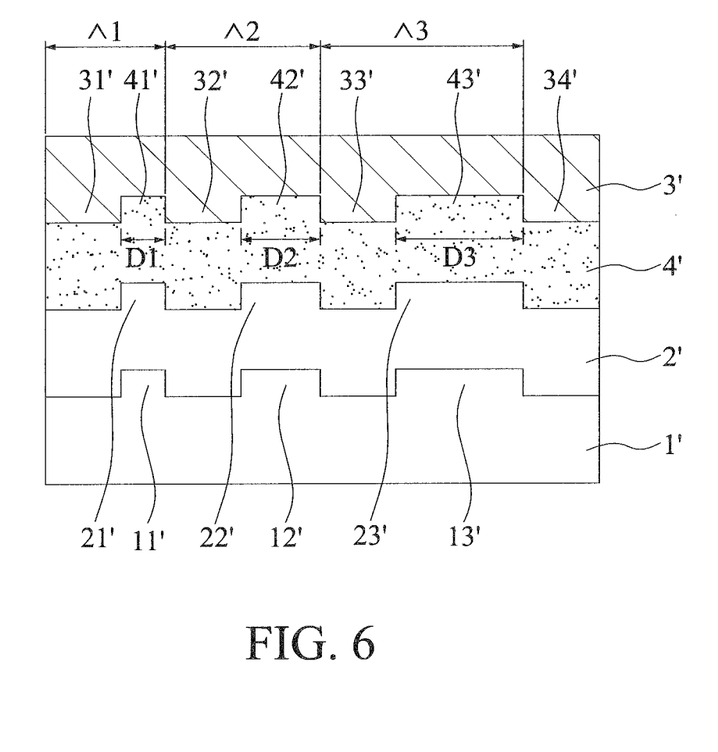
FIG. 6 is a schematic cross-sectional view of a light emitting device according to a sixth embodiment of the present disclosure.

Refer to FIG. 6 showing a schematic cross-sectional view of a light emitting device according to a sixth embodiment of the present disclosure. The sixth embodiment differs from the fifth embodiment in that in the sixth embodiment the organic material layer comprises a first emitting portion 41', a second emitting portion 42' and a third emitting portion 43' protruding into the metal layer 3', and the metal layer 3' comprises a first metal region 31', a second metal region 32', a third metal region 33' and a fourth metal region 34' that are separated by the first emitting portion 41', the second emitting portion 42' and the third emitting portion 43'. The width of the first emitting portion 41' is the lateral distance D1 between the first metal region 31' and the second metal region 32', and the first metal region 31' and the second metal region 32' have a period Λ1. The period Λ1 and the lateral distance D1 are configured to enable a lateral plasma coupling generated in the first metal region 31' and the second metal region 32', such that light generated by the organic material layer 4' has a gain in a first waveband, or a peak wavelength of the light generated by the first emitting portion 41' shifts to the first waveband. The width of the second emitting portion 42' is the lateral distance D2 between the second metal region 32' and the third metal region 33', and the second metal region 32' and the third metal region 33' have a period Λ2. The period Λ2 and the lateral distance D2 are configured to enable a lateral plasma coupling generated in the second metal region 32' and the third metal region 33', such that light generated by the organic material layer 4' has a gain in a second waveband, or a peak wavelength of the light generated by the second emitting portion 42' shifts to the second waveband. The width of the third emitting portion 43' is the lateral distance D3 between the third metal region 33' and the fourth metal region 34', and the third metal region 33' and the fourth metal region 34' have a period Λ3. The period Λ3 and the lateral distance D3 are configured to enable a lateral plasma coupling generated in the third metal region 33' and the fourth metal region 34', such that light generated by the third emitting portion 43' has a gain in a third waveband, or a peak wavelength of the light generated by the third emitting portion 43' shifts to the third waveband.

In an embodiment, adjusting the lateral distance D1 and the period Λ1 results in the generation of a gain in blue-light waveband to the light of the organic material layer 4' or causes the first emitting portion 41' to emit blue light. In another embodiment, adjusting the lateral distance D2 and the period Λ2 results in the generation of a gain in green-light waveband to the light of the organic material layer 4' or causes the second emitting portion 42' to emit green light. In yet another embodiment, adjusting the lateral distance D3 and the period Λ3 results in the generation of a gain in red-light waveband to the light of the organic material layer 4' or causes the third emitting portion 43' to emit red light. The lateral distance D1 is less than the lateral distance D2, and the lateral distance D2 is less than the lateral distance D3. The period Λ1 is less than the period Λ2, and the period Λ2 is less than the period Λ3. The dimensions of lateral distances D1 to D3, and periods Λ1 to Λ3 can be referred to FIG. 1B. The shifts and gains of peak wavelength of light from the organic material layer are indicated in FIGS. 1D and 1E.

The light emitting device shown in FIG. 6 comprising the first emitting portion 41', the second emitting portion 42' and the third emitting portion 43' is capable of emitting lights of three wavebands, such as blue light, green light and red light, so as to constitute white light.

In accordance with the fourth embodiment to the sixth embodiment as illustrated in FIGS. 4 to 6, respectively, the light emitting device according to present disclosure comprises an electrode layer, an organic material layer and a metal layer sequentially stacked on a substrate. When a voltage is applied to the light emitting device, the lateral plasma coupling between the metal regions enables a gain in a waveband generated to the light of the organic material layer, or causes the peak wavelength to shift to the waveband, such that the light emitting device produces red light, green light, blue light or gained red light, gained green light, gained blue light, or white light constituted by the aforementioned lights.

Furthermore, the first emitting portion 41', the second emitting portion 42', the third emitting portion 43' of the organic material layer 4' can be formed by photolithography, deposition, etc., or by the following steps: providing a substrate 1' having first protruding portions 11', 12' and 13'; forming an electrode layer 2' on the substrate 1 such that the first protruding portions 11', 12' and 13' protruding into the electrode layer 2', and the electrode layer 2' comprising second protruding portions 21', 22' and 23' corresponding to the first protruding portions 11', 12' and 13', respectively; forming an organic material layer 4' on the electrode layer 2' such that the second protruding portions 21', 22' and 23' protruding into the organic material layer 4', and the organic material layer 4' comprising first emitting portion 41', second emitting portion 42' and third emitting portion 43' corresponding to the second protruding portions 21', 22' and 23', respectively.

Based on the above, the light emitting device of the present application comprises an organic material layer formed by a material covering full spectrum. By the lateral plasma coupling between the metal portions of the first metal layer or the lateral plasma coupling between the metal regions of the metal layer, a gain in the red-light, green-light or blue-light waveband is generated to the light of the organic material layer, or the light from the emitting regions between the metal portions or from the emitting portions between the metal regions shifts to red-light, green-light or blue-light waveband.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

The invention claimed is:

1. A light emitting device, comprising:
    an electrode layer;
    a first metal layer disposed on the electrode layer and comprising a first metal portion and a second metal portion separated from the first metal portion at a first lateral distance, wherein the first metal portion and the second metal portion have a first period;
    a second metal layer disposed above the first metal layer; and
    an organic material layer disposed between the electrode layer and the second metal layer and comprising a first emitting region separating the first metal portion from the second metal portion,
    wherein the first lateral distance and the first period enable a lateral plasma coupling generated between the first metal portion and the second metal portion, such that light generated by the organic material layer at the first emitting region has a gain in a first waveband, or a peak wavelength of the light generated at the first emitting region shifts to the first waveband.

2. The light emitting device of claim 1, wherein the light having the gain has a peak wavelength greater than a peak wavelength of light generated by the organic material layer, or the shifted light has a peak wavelength greater than a peak wavelength of the light generated by the organic material layer.

3. The light emitting device of claim 1, wherein the light having the gain has a peak wavelength less than a peak wavelength of light generated by the organic material layer, or the shifted light has a peak wavelength less than a peak wavelength of the light generated by the organic material layer.

4. The light emitting device of claim 1, wherein the first period is 200 nm, the first lateral distance is from 50 nm to 120 nm, and the first waveband is from 399 nm to 460 nm.

5. The light emitting device of claim 1, wherein the first period is 250 nm, the first lateral distance is from 100 nm to 200 nm, and the first waveband is from 471 nm to 496 nm.

6. The light emitting device of claim 1, wherein the first period is 300 nm, the first lateral distance is from 100 nm to 250 nm, and the first waveband is from 529 nm to 580 nm.

7. The light emitting device of claim 1, wherein the first period is 350 nm, the first lateral distance is from 130 nm to 250 nm, and the first waveband is from 566 nm to 580 nm.

8. The light emitting device of claim 1, wherein the first period is 400 nm, the first lateral distance is from 125 nm to 250 nm, and the first waveband is from 595 nm to 607 nm.

9. The light emitting device of claim 1, wherein the first period is 450 nm, the first lateral distance is from 130 nm to 250 nm, and the first waveband is from 612 nm to 632 nm.

10. The light emitting device of claim 1, wherein the first period is 500 nm, the first lateral distance is from 125 nm to 250 nm, and the first waveband is from 655 nm to 680 nm.

11. The light emitting device of claim 1, wherein the first period is 550 nm, the first lateral distance is from 130 nm to 220 nm, and the first waveband is from 697 nm to 723 nm.

12. The light emitting device of claim 1, wherein the organic material layer is further formed between the first metal layer and the second metal layer, and the first metal portion and the second metal layer are separated at a first vertical distance for enabling a vertical plasma coupling generated between the first metal portion and the second metal layer, such that a peak wavelength of light generated by the organic material layer between the first metal portion and the second metal layer shifts to an $A^{th}$ waveband.

13. The light emitting device of claim 12, wherein as a thickness of the first metal portion increases and the first vertical distance decreases, the $A^{th}$ waveband is a blue-light waveband, and as the thickness of the first metal portion decreases and the first vertical distance increases, the $A^{th}$ waveband is a red-light waveband, and wherein the thickness of the first metal portion is between 5 nm and 20 nm, and the first vertical distance is between 75 nm and 130 nm.

14. The light emitting device of claim 12, wherein the second metal portion and the second metal layer are separated at a second vertical distance for enabling a vertical plasma coupling generated between the second metal portion and the second metal layer, such that a peak wavelength of light generated by the organic material layer between the second metal portion and the second metal layer shifts to a $B^{th}$ waveband.

15. The light emitting device of claim 14, wherein as a thickness of the first metal portion decreases and the first vertical distance increases, the $A^{th}$ waveband is a red-light waveband; as a thickness of the second metal portion increases and the second vertical distance decreases, the $B^{th}$ waveband is a blue-light waveband; as the thickness of the first metal portion increases and the first vertical distance decreases, the $A^{th}$ waveband is a blue-light waveband; and as the thickness of the second metal portion decreases and the second vertical distance increases, the $B^{th}$ waveband is a red-light waveband, and wherein the thickness of the first metal portion and the second metal portion is between 5 nm and 20 nm, and the first vertical distance and the second vertical distance are between 75 nm and 130 nm.

16. The light emitting device of claim 1, wherein the first metal layer further comprises a third metal portion, and the organic material layer further comprises a second emitting region separating the second metal portion from the third metal portion, wherein the second metal portion and the third metal portion have a second period, the second metal portion and the third metal portion are separated from each other by a second lateral distance, and the second period and the second lateral distance enable a lateral plasma coupling generated between the second metal portion and the third metal portion, such that light generated by the organic material layer at the second emitting region has a gain in a second waveband, or a peak wavelength of the light generated by the second emitting region shifts to the second waveband.

17. The light emitting device of claim 16, wherein the light generated by the organic material layer has a spectrum covering a blue-light waveband and a red-light waveband, the peak wavelength of the light generated by the organic material layer is located in a green-light waveband, the first waveband is a blue-light waveband, and the second waveband is a red-light waveband, and wherein the first lateral distance is less than the second lateral distance, the first period is less than the second period, and the light emitting device emits white light constituted by green light, blue light and red light.

18. The light emitting device of claim 16, wherein the organic material layer is further formed between the first metal layer and the second metal layer, and at least one of the first metal portion, the second metal portion and the third metal portion is separated from the second metal layer at a first vertical distance for enabling a vertical plasma coupling generated between the second metal layer and the at least one of the first metal portion, the second metal portion and the third metal portion, such that a peak wavelength of light generated by the organic material layer between the second metal layer and the at least one of the first metal portion, the second metal portion and the third metal portion shifts to a $C^{th}$ waveband.

19. The light emitting device of claim 18, wherein the first waveband is a blue-light waveband, the second waveband is a red-light waveband, and the $C^{th}$ waveband is a green-light waveband, and wherein the first lateral distance is less than the second lateral distance, the first period is less than the second period, and the light emitting device emits white light constituted by green light, blue light and red light.

20. The light emitting device of claim 16, wherein the first metal layer further comprises a fourth metal portion, and the organic material layer further comprises a third emitting region separating the third metal portion and the fourth metal portion, and wherein the third metal portion and the fourth metal portion have a third period, the third metal portion and the fourth metal portion are separated at a third lateral distance, and the third period and the third lateral distance enable a lateral plasma coupling generated between the third metal portion and the fourth metal portion, such that light generated by the organic material layer at the third emitting region has a gain in a third waveband, or a peak wavelength of the light generated by the third emitting region shifts to the third waveband.

21. The light emitting device of claim 20, wherein the first waveband is blue-light waveband, the second waveband is green-light waveband, and the third waveband is red-light waveband, and wherein the first lateral distance is less than the second lateral distance, the second lateral distance is less than the third lateral distance, the first period is less than the second period, the second period is less than the third period, and the light emitting device emits white light constituted by red light, green light and blue light.

22. The light emitting device of claim 1, wherein the first metal portion and the second metal portion comprise metal articles.

23. A light emitting device, comprising:
an electrode layer;
a metal layer disposed above the electrode layer and having a first metal region and a second metal region; and
an organic material layer disposed between the electrode layer and the metal layer and comprising a first emitting portion protruding into the metal layer and separating the first metal region and the second metal region, wherein the first metal region and the second metal region have a first period and are separated from each other by a first lateral distance, and the first period and the first lateral distance enable a lateral plasma coupling generated in the first metal region and the second metal region, such that light generated by the organic material layer at the first emitting portion has a gain in a first waveband, or a peak wavelength of the light generated by the first emitting portion shifts to the first waveband.

24. The light emitting device of claim 23, wherein the light having the gain has a peak wavelength greater than a peak wavelength of light generated by the organic material layer, or the shifted light has a peak wavelength greater than a peak wavelength of the light generated by the organic material layer.

25. The light emitting device of claim 23, wherein the light having the gain has a peak wavelength less than a peak wavelength of light generated by the organic material layer, or the shifted light has a peak wavelength less than a peak wavelength of the light generated by the organic material layer.

26. The light emitting device of claim 23, wherein the organic material layer further comprises a second emitting portion protruding into the metal layer, and the metal layer further comprises a third metal region separated from the second metal region by the second emitting portion, and wherein the second metal region and the third metal region have a second period and are separated from each other by a second lateral distance, and the second period and the second lateral distance enable a lateral plasma coupling generated in the second metal region and the third metal region, such that light generated by the organic material layer at the second emitting portion has a gain in a second waveband, or a peak wavelength of the light generated by the second emitting portion shifts to the second waveband.

27. The light emitting device of claim 26, wherein the light generated by the organic material layer has a spectrum covering a blue-light waveband and a red-light waveband, the peak wavelength of the light generated by the organic material layer is located in a green-light waveband, the first waveband is a blue-light waveband, and the second waveband is a red-light waveband, and wherein the first lateral distance is less than the second lateral distance, the first period is less than the second period, and the light emitting device emits white light constituted by green light, blue light and red light.

28. The light emitting device of claim 26, wherein the organic material layer further comprises a third emitting portion protruding into the metal layer, and the metal layer further comprises a fourth metal region separated from the third metal region by the third emitting portion, and wherein the third metal region and the fourth metal region have a third period and are separated from each other by a third lateral distance, and the third period and the third lateral distance enable a lateral plasma coupling generated in the third metal region and the fourth metal region, such that light generated by the organic material layer at the third emitting portion has a gain in a third waveband, or a peak wavelength of the light generated by the third emitting portion shifts to the third waveband.

29. The light emitting device of claim 28, wherein the first waveband is a blue-light waveband, the second waveband is a green-light waveband, and the third waveband is a red-light waveband, and wherein the first lateral distance is less than the second lateral distance, the second lateral distance is less than the third lateral distance, the first period is less than the second period, the second period is less than the third period, and the light emitting device emits white light constituted by red light, green light and blue light.

30. The light emitting device of claim 23, further comprising a substrate, wherein the electrode layer, the organic material layer and the metal layer are stacked on the substrate sequentially, the substrate comprises a first protruding portion protruding into the electrode layer, the electrode layer comprises a second protruding portion protruding into the organic material layer, and the first protruding portion, the second protruding portion and the first emitting portion are disposed with one another correspondingly.

\* \* \* \* \*